United States Patent [19]

Voegeli

[11] 4,280,194
[45] Jul. 21, 1981

[54] PARAMETRIC BUBBLE DETECTOR

[75] Inventor: Otto Voegeli, Morgan Hill, Calif.

[73] Assignee: International Business Machines Corporation, Armonk, N.Y.

[21] Appl. No.: 97,451

[22] Filed: Nov. 26, 1979

[51] Int. Cl.³ .............................................. G11C 19/08
[52] U.S. Cl. ........................................ 365/7; 365/173
[58] Field of Search .................. 365/7, 8, 9, 10, 158, 365/173; 307/402, 403, 405

[56] References Cited

U.S. PATENT DOCUMENTS

| | | | |
|---|---|---|---|
| 3,497,713 | 2/1970 | Davis | 307/403 |
| 3,633,188 | 1/1972 | Bittman | 365/171 |
| 3,691,540 | 9/1972 | Almasi et al. | 365/8 |
| 3,736,419 | 5/1973 | Almasi et al. | 365/8 |
| 3,829,894 | 8/1974 | Watanbe et al. | 360/111 |
| 3,842,407 | 10/1974 | Argyle et al. | 365/7 |
| 3,860,965 | 1/1975 | Voegeli | 365/8 |
| 4,048,557 | 9/1977 | Chen | 365/8 |
| 4,137,554 | 1/1979 | McClure | 360/111 |
| 4,177,521 | 12/1979 | Schaefer | 365/8 |

FOREIGN PATENT DOCUMENTS 612282  6/1978  U.S.S.R. ...................................... 365/7

Primary Examiner—James W. Moffitt
Attorney, Agent, or Firm—Joseph E. Kieninger

[57] ABSTRACT

A parametric bubble detector contains a coupled film sensor stripe and an excitation conductor which, electrically insulated from each other, cross at right angles. A sensor stripe consists of a pair of superpositioned Permalloy stripes which are separated by a thin nonmagnetic layer. A high frequency excitation current in the conductor produces an inductive output signal in the sensor stripe. The waveform of this periodic signal is responsive to bubble domains proximate to the sensor/conductor crossover area.

8 Claims, 3 Drawing Figures

PARAMETRIC BUBBLE DETECTOR

DESCRIPTION

1. Technical Field

This invention relates to bubble domain detection and more particularly to a parametric bubble domain detector.

It is a primary object of this invention to provide an improved bubble detector.

It is still another object of this invention to provide a bubble detector having a small and localized active sensing region.

It is another object of this invention to provide a bubble detector having sufficient sensitivity to allow for bubble detection without substantial domain stretching.

It is another object of this invention to provide a bubble detector suitable for nondestructive sensing of data.

It is another object of this invention to provide a bubble detector which is insensitive to noise signals from the memory's accessing functions.

It is yet another object of this invention to provide a bubble detector which can be fabricated with the conventional bubble memory processing steps.

It is a further object of this invention to provide a bubble detector whose response to bubble domains is anhysteretic.

2. Background Art

Four general techniques have been described for sensing of magnetic bubble domains. These are inductive sensing, hall effect sensing, magneto-optical sensing and magneto-resistive sensing. At the present time, the magneto resistive sensing technique is the one commonly used throughout the industry, since the other techniques are inferior to magneto-resistive sensing techniques. The magneto-resistive sensing of bubble domains is described in detail in U.S. Pat. No. 3,691,540 assigned to the assignee of the present invention.

In order to produce an adequate output signal, present magneto-resistive detectors for bubble devices require a domain to be stretched many bubble diameters in length. This stretching requires an expander device which takes up a significant area of the bubble chip and generally limits the performance characteristics such as the bias margins and/or data rate of the bubble memory. Additionally, the magnetoresistive detector is impractical for bubble detection without substantial domain stretching, because it does not provide a localized sensing region. A magneto-resistive sensor stripe is responsive to field conditions along its entire length and hence, produces large interfering signals from fields associated with memory accessing functions.

The use of parametric magnetic sensors or detectors has been employed for the nondestructive readout in tapes and other magnetic records and are described in the U.S. Pat. Nos. 3,633,188; 3,829,894 and 4,137,554. These patents describe excitation means interacting with a magnetic element to produce an output signal in a pick-up coil. They do not disclose a localized sensing area suitable for bubble detection, nor are the disclosed embodiments manufacturable with the conventional bubble memory processing steps.

BRIEF DESCRIPTION OF THE DRAWINGS

In the accompanying drawings forming a material part of this disclosure.

DISCLOSURE OF THE INVENTION

For a further understanding of the invention and of the objects and advantages thereof, reference will be had to the following description and accompanying drawings, and to the appended claims in which the various novel features of the invention are more particularly set forth.

A device for detecting magnetic fields from a bubble domain is described. The parametric detector includes a coupled film sensor stripe and an excitation conductor which, electrically insulated from each other, cross at right angles. This crossover area forms the active sensing region of the device.

The sensor stripe consists of a pair of superpositioned stripes of soft magnetic materials, for example, Permalloy, which are separated by a thin nonmagnetic layer. The state of magnetization within these coupled Permalloy films is one of circumferrentially closed flux with a defined handedness imposed by a small direct current through the stripe. The amount of closed flux decreases with the presence of a magnetic field parallel to the stripe, such as with the field from a proximate bubble domain.

The local state of magnetization within the active sensing region is interrogated by means of a high frequency alternating current through the excitation conductor. Within the limited area of interaction, the associated alternating excitation field causes a vacillation of the magnetization about its quiescent state. The resulting circumferential flux modulation inductively produces a periodic output signal whose waveform is determined by the local quiescent state of magnetization. The presence or absence of a bubble proximate to the limited area of interaction thus manifests itself by a change of waveform of this high frequency output signal.

BEST MODE FOR CARRYING OUT THE INVENTION

Figure 1:
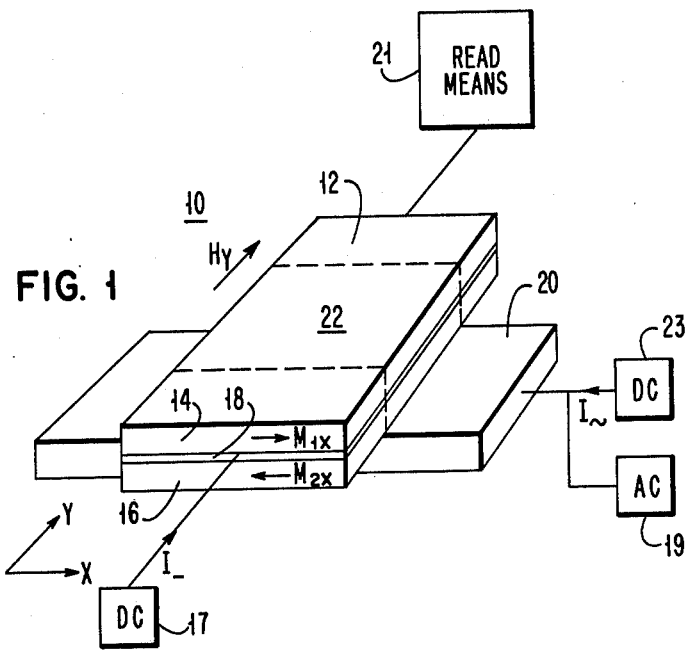
FIG. 1 is a perspective view of the device.

A preferred embodiment of a parametric detector is shown in FIG. 1. The detector comprises a coupled film sensor stripe 12 and an excitation conductor stripe 20. The sensor stripe 12 includes a top layer 14 and a bottom layer 16, made of soft magnetic material such as Permalloy, both layers having substantially identical physical and magnetic characteristics. The thickness of the sensor stripe 12 is of the order of four thousand Angstroms, the typical thickness of a bubble propagation element. The two layers 14 and 16 are separated by a thin nonmagnetic layer 18 to break the magnetic exchange coupling between these layers. Layer 18 can be made of either a conducting or insulating material, such a Ti or $SiO_2$, for example, and has a thickness of about 200 to 400 Angstroms. The layer 18 should be as thin as possible while at the same time being continuous.

The sensor stripe 12 and the excitation conductor stripe 20 cross each other at approximately right angles. They are electrically insulated from each other by an insulation layer (not shown) whose thickness is substantially less than the width of the conductor stripe 20. The crossover area 22 forms the active sensing region of the device as explained in the following functional description.

The top and bottom layers 14 and 16 of the sensor stripe 12 are magnetostatically coupled along their edges so that their respective x-components of magnetization are antiparallel. These components are shown in FIG. 1 as $M_{1X}$ for layer 14 and $M_{2X}$ for layer 16, $M_{2X}$ having the same magnitude as $M_{1X}$ but pointing in the opposite direction. This state of magnetization contains a circumferential loop of closed flux around the center line of the sensor stripe 12. A defined handedness of this circumferential flux, which is clockwise in the example of FIG. 1, is imposed by the magnetic field from a direct current $I_-$ from source 17 through the sensor stripe 12. The amount of circumferential flux depends on the value of $I_-$ as well as on any magnetic field component $H_y$ parallel to the sensor stripe 12. A field component $H_y$ originates from the rotating memory drive field and from any bubble domain proximate to the sensor stripe 12. It has been found that, irrespective of the sign of $H_y$, the value of circumferential flux decreases with increasing magnitude of $H_y$. Although the value of circumferential flux may vary with $H_y$ along the sensor stripe 12, use of the excitation means allows one to determine the state of magnetization within the localized crossover area 22.

The interrogation of this local state of magnetization is accomplished by sending a high frequency alternating current from source 19 through the excitation conductor 20. The resulting excitation field produces, within the limited area of the interaction, a high frequency vacillation of the sensor stripe magnetization about its quiescent state. The associated modulation of circumferential flux produces an inductive output signal from the sensor stripe 12. The amplitude of this high frequency signal increases with amplitude and frequency of the excitation current, while the waveform depends upon the local state of magnetization and thus on the value of $H_y$ within the limited region of interaction. This dependence of waveform is caused by the very nonlinear relation between $H_y$ and circumferential flux. Data is thus read in read means 21 by discriminating between the waveforms occurring with the presence of absence of a bubble proximate to the active region 22 of the sensor stripe 12. Such discrimination is often aided by biasing the active region with a constant $H_y$ field to a quiescent state which produces a maximum change of waveform for the presence or absence of a bubble. Such an $H_y$ bias field can be conveniently applied by adding a direct current from source 23 to the conductor 20.

Waveform discrimination occurs in the read means 21. The read means 21 is tuned to the sensor excitation frequency which is substantially higher than the memory operated frequency, that is, the read means 21 is such as to reject all signals having a frequency lower than the excitation frequency. The read means 21 thus rejects noise signals due to memory access functions. In a preferred system, the read means 21 is tuned to a frequency twice the excitation frequency. This system detects the presence or absence of a bubble by a change in the second harmonic amplitude of the signal waveform. This approach is preferred as the read system also rejects any undesirable signals from any electrical coupling between sensor stripe and excitation means.

Figure 2:
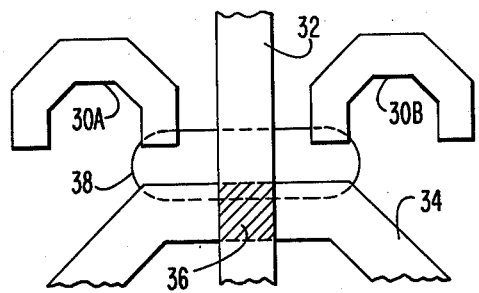
FIG. 2 is a top view of the bubble device having one embodiment of a parametric bubble detector.

FIG. 2 shows an example of a parametric detector implemented along C-bar type propagation track. The C-bar propagation track consists of C-bar elements 30A and 30B. The sensor stripe 32 passes through the gap between the adjacent C-bar 30A and 30B and crosses over the excitation conductor 34 to form a crossover area 36. A bubble domain 38 propagates between C-bar elements 30A and 30B and is detected by the crossover area 36. The direct current in the excitation conductor 34 lowers the bias field in the gap area, thereby facilitating the bubble domain crossing the gap.

Figure 3:
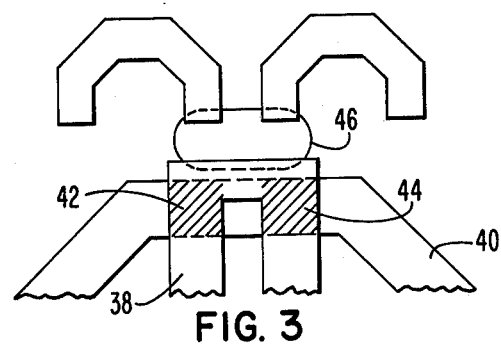
FIG. 3 is a top view of a bubble device having an alternate embodiment of a parametric bubble detector.

FIG. 3 is another example of a parametric detector. This parametric detector has a folded sensor stripe 38 which crosses the excitation conductor 40 to form a pair of crossover active areas 42 and 44 for sensing the bubble 46. With this configuration, the second harmonic signals from the crossover areas 42 and 44 are additive.

INDUSTRIAL APPLICABILITY

While this invention is useful for the broad application of magnetic transducers, it is of particular interest as a parametric bubble detector. The following is a specific application of this invention as a parametric bubble detector.

EXAMPLE NO. 1

An inductive output signal of 240 microvolts was obtained from a pair of 4 micron by 8 micron sense elements at 30 MHz excitation. This signal was measured with a 35 mA excitation current and a 2 mA D.C. bias current through the coupled film sense element. A 55 Oe rotating field produces a 72% amplitude modulation of the carrier signal.

While I have illustrated and described the preferred embodiment in my invention, it is understood that I do not limit myself to the precise steps herein, and the right is secured to all changes and modifications coming within the scope of the invention as defined in the appended claims.

I claim:

1. A parametric bubble detector comprising a coupled film sensor strip, and excitation means interacting over a limited area with said stripe wherein the passage of a periodically varying current in said excitation means produces a similarly periodic inductive output signal from said stripe having a waveform responsive to the present of a bubble domain proximal to said limited area.

2. A detector as described in claim 1 wherein said coupled film sensor stripe comprises a pair of substantially identical soft magnetic layers separated by a nonmagnetic layer whose thickness is substantially smaller than the thickness of either magnetic layer.

3. A detector as described in claim 1 including means for supplying a direct current to said sensor stripe.

4. A detector as described in claim 1 including a read means responsive to the amplitude of the second harmonic of the periodic output waveform.

5. A detector as described in claim 1 wherein said excitation means is a current conductor stripe which crosses the sensor stripe at right angles to form a limited area of interaction.

6. A detector as described in claim 5 including means for supplying an alternating current to said conductor stripe.

7. A detector as described in claim 5 including means for supplying a direct current to said conductor stripe.

8. A detector as described in claim 5 wherein said stripe forms at least two areas of interaction with said conductor.

* * * * *